(12) United States Patent
Watanabe et al.

(10) Patent No.: US 7,472,361 B2
(45) Date of Patent: Dec. 30, 2008

(54) SYSTEM AND METHOD FOR GENERATING A PLURALITY OF MODELS AT DIFFERENT LEVELS OF ABSTRACTION FROM A SINGLE MASTER MODEL

(75) Inventors: Yosinori Watanabe, El Cerrito, CA (US); Luciano Lavagno, Berkeley, CA (US); Alex Kondratyev, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 58 days.

(21) Appl. No.: 11/324,029

(22) Filed: Dec. 30, 2005

(65) Prior Publication Data
US 2007/0168893 A1  Jul. 19, 2007

(51) Int. Cl.
*G06F 17/50* (2006.01)
(52) U.S. Cl. ............... 716/3; 716/1; 716/5; 716/18
(58) Field of Classification Search ............... 716/18, 716/1–7
See application file for complete search history.

(56) References Cited

U.S. PATENT DOCUMENTS

| 5,903,466 A * | 5/1999 | Beausang et al. ............. 716/18 |
| 6,169,968 B1 * | 1/2001 | Kabuo ............. 703/14 |
| 6,182,258 B1 * | 1/2001 | Hollander ............. 714/739 |
| 6,779,163 B2 | 8/2004 | Bednar et al. |
| 6,820,240 B2 | 11/2004 | Bednar et al. |
| 6,883,152 B2 | 4/2005 | Bednar et al. |
| 2005/0149898 A1 | 7/2005 | Hakewill et al. |
| 2007/0067751 A1 | 3/2007 | Seno |

OTHER PUBLICATIONS

Cesario et al., "Efficient Integration of Behavioral Synthesis within Existing Design Flows", Sep. 2000, IEEE 13th International Symposium on System Synthesis, Proceddings, pp. 85-90.*
Calazans et al., "From VHDL Register Transfer Level to SystemC Tranaction Level Modeling: A Comparative Case Study", Sep. 2003, IEEE 16th Integrated Circuits and System Design, Proceedings, pp. 355-360.*
Cai et al.,"Transaction Level Modeling: An Overview", Oct. 2003, ACM, pp. 19-24.*
Hardee,"Transaction-Level Modeling and ConvergenSC Products", 2003, coWareInc, paper 6 pages.*
Punkka,"SystemC System-Level Modeling", 2004, Tampere University of Technology, technology presentation slides, 10 pages.*

(Continued)

*Primary Examiner*—Sun J Lin
(74) *Attorney, Agent, or Firm*—Stephen C. Durant; Duane Morris LLP

(57) ABSTRACT

A method of producing multiple models of a hardware (integrated circuit) design including: translating a master model of a design of the integrated circuit to at least first and second models that are functionally equivalent to the master model and that are at different levels of abstraction from each, other and in which each of the first and second models includes integrated circuit timing information that is accurate for its level of abstraction.

19 Claims, 2 Drawing Sheets

OTHER PUBLICATIONS

Rissa et al.,"Evaluation of SystemC Modeling of Reconfigurable Embedded System", 2005, Design, Automation and Test in Europe amd Exhibition, Proceddings, vol. 3, pp. 253-258.*

U.S. Appl. No. 11/324,004, filed Dec. 30, 2005, Knapp et al.
U.S. Appl. No. 11/324,032, filed Dec. 30, 2005, Watanabe et al.
U.S. Appl. No. 11/324,169, filed Dec. 30, 2005, McNamara.

* cited by examiner

SYSTEM AND METHOD FOR GENERATING A PLURALITY OF MODELS AT DIFFERENT LEVELS OF ABSTRACTION FROM A SINGLE MASTER MODEL

CROSS REFERENCE TO RELATED APPLICATIONS

This application relates to the following commonly assigned patent applications: System and Method for Synthesis Reuse, filed Dec. 30, 2005; System and Method for Verification Aware Synthesis, filed Dec. 30, 2005; and System and Method for Incremental Synthesis, filed Dec. 30, 2005, each of which is expressly incorporated herein in its entirety by this reference.

BACKGROUND OF THE INVENTION

1. Field of the Invention

The invention relates in general to the design of integrated circuits and more particularly, to the use of modes at different levels of abstraction during the design of integrated circuits.

2. Description of the Related Art

Modern circuit design has evolved into a specialized field often referred to as electronic design automation in which computers and computer aided design (CAD) techniques are used to automate the integrated circuit (IC) design process. An IC design process typically begins with an engineer specifying the input/output signals, functionality and performance characteristics of a hardware circuit to be fabricated. In the past the design of integrated circuits often involved creation of a low level Register Transfer Level (RTL) model of an IC device, which was used as an input to an automated digital synthesis tool. More particularly, an RTL model specifies storage elements (e.g. latches, flip-flops, memory words) that accept input logic states and hold them as directed by timing signals. The timing signals may be clock edges, clock phases or reset, for example. Transfer refers to input-to-register, register-to-register and register-to-output equations and/or transformations. Although there may be a range of abstractions for RTL equation and transformation notations, RTL provides cycle-by-cycle state-by-state correspondence with gate-level design. However all of the detailed timing and synchronization information in RTL models often causes them to simulate relatively slowly. Unfortunately, this can make them not well suited to running simulations with real inputs.

One alternative is to accelerate testing of a design by running it on a hardware emulator. Often although an emulator runs fast enough for testing the core routines of a circuit; it still may be too slow to test software designed to run on the IC design. Another problem with using an emulator is that one must have the IC design at a state of development where it is completely specified, and ready to be fabricated into hardware in order to run the design on an emulator. Since emulators are very expensive, some companies just skip the emulation step and fabricate the actual chip, and test the software at full hardware speed. In view of the costs of emulation and the time required for more thorough simulation, they take the risk that the resulting chip will function adequately even though testing, particularly software testing, has been cut short. If there are hardware bugs that are not too severe, then a software work around may suffice to make the IC useable. If there are bugs that are too severe to work around using software, then the chip hardware may have to be changed, which typically requires a re-design and fabrication of a new chip at significant cost in time and money.

More recently, Transaction Level Model (TLM) based design methodology has been proposed. A system architecture model is produced that describes a product specification or critical system parameters. The system architecture model is refined into a transaction level model (TLM). The transaction level model is used in the development of RTL models suitable for synthesis and in parallel development of software.

While earlier approaches to design of integrated circuits generally have been acceptable, there have been shortcomings with their use. For example, there has been a need for a techniques to improve coordination of hardware and software development during IC design. The present invention meets this need.

SUMMARY OF THE INVENTION

In one aspect, a method of producing multiple models of a hardware design is provided. A master model of a design is translated to at least first and second models that are functionally equivalent to the master model. The first and second models are at different levels of abstraction from each. The first and second models each includes timing information that is accurate for its level of abstraction.

DESCRIPTION OF THE PREFERRED EMBODIMENT

Figure 1:
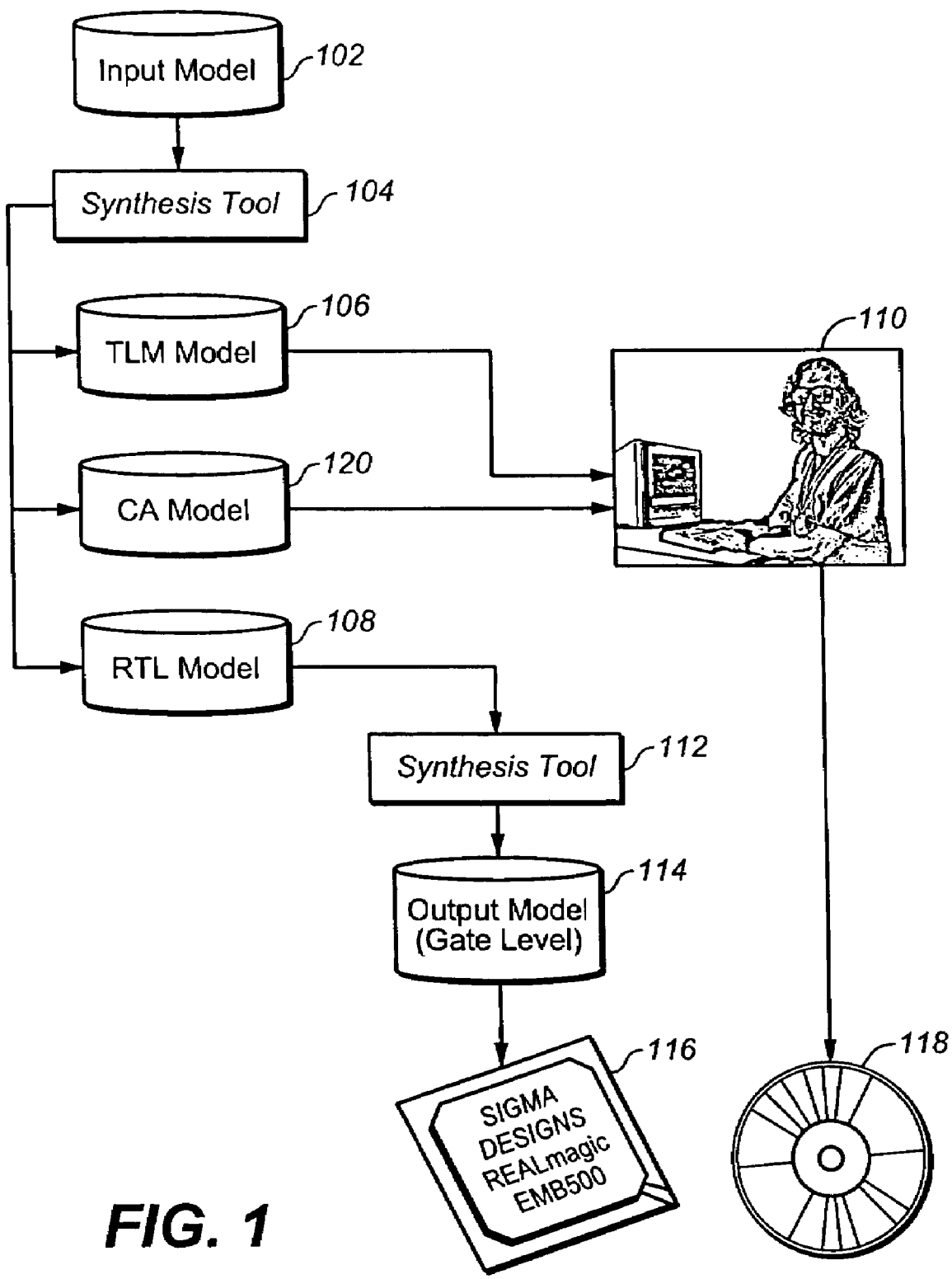
FIG. 1 is an illustrative flow diagram of a process to use a single input model to produce multiple equivalent models at different levels of abstraction.

The following description is presented to enable any person skilled in the art to make and use a system and apparatus for generating multiple models of integrated circuit hardware at different levels of abstraction from a single master model of the circuit in accordance with the embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

In accordance with an embodiment of the invention, a master model is used to produce multiple hardware models, each at a different level of abstraction. As used herein, "master model" refers a definitive description of the behavior of a desired device. The master model serves as the source model from which other models are derived via the use of set of computer programs. As used herein, the more general term "model" is used to describe any representation of the behavior of the desired device, that is in some form other than the actual device. A master model at a minimum specifies an input, an output and at least one function between them. The master model also may include complete timing information, partial timing information or no timing information at all.

The produced models are functionally equivalent to the master model, and therefore, are functionally equivalent to each other. By functionally equivalent it is meant that these derived models, when presented with any input that is a legal sequence, will produce the same sequence of output as would the master model. Note that there is freedom to call a derived model functionally equivalent with the master model even when the derived model behaves differently than the master model when presented with a sequence of inputs that is not a sequence that would occur in any use of the device In one embodiment, the produced models comprises a cycle accurate model and a transaction accurate model. A cycle accurate model accurately specifies calculations or activities occurring during each clock cycle, or more specifically, at clock edges, of an implementation of the master model. For purposes herein, functionality is defined between inputs and outputs, while activities refer to operations implemented in hardware, such as addition, for example, which are necessary to implement the function. A transaction accurate model accurately specifies the clock timing of transactions involved in an implementation of the master model.

As used herein a 'transaction' is a complete interaction. For example, a transaction might be a fetch of a word from memory, or the decode of a frame of video from its compressed form; or the execution of a machine instruction. A transaction typically requires several (2-20) clock cycles to execute, for example. Considerable freedom is available to the user to define the level of complexity of the various transactions that make sense in modeling a device. The basic concept is that a user would define as a transaction an operation at a much higher level than absolutely basic, lowest levels of work the device performs, but not so high level as to be the entire device. When examining the execution of a transaction level accurate model, one can see the state of the device before the transaction begins, and after it completes. However, one typically gets no visibility into the various steps that make up the performance of the transaction. Specifically, given a transaction that requires 6 clock cycles to execute; examining the state of the model 3 cycles after the transaction has begun will reveal no evidence that the operation is underway. Instead, on the sixth cycle the model will emit the answer fully formed. As such the transaction level model can quickly calculate the end result of a transaction without need for taking each step the real device would perform, and hence the model, when running on a computer, which can only do one thing at a time, will execute much more quickly than a more faithful model.

The cycle accurate model is at a lower level of abstraction than the transaction accurate model. A cycle accurate model ordinarily describes calculations and activities involved in realizing each function in the master model in a way in which every register, or storage element in the design, will have the same values as would the real device at each and every clock edge of simulation; however, the intermediate calculations that go on between the clock cycles are abstracted away, in the interest of faster simulation. As with the transaction level model, the new values for all of the registers appear at each clock edge, but there is no way to discover which ones were calculated early in the clock cycle, and which later.

Another level of modeling is the register transfer level, or register transfer and/or transistor level, where every operation's order of execution, and hence the complete timing is specified. In contrast, a transaction accurate model typically describes data calculation and data flow, but without detailed lower abstraction level operations, such as transistor level calculations, and without specifying the detailed scheduling infrastructure, such as register transfers for example, used to implement a hardware device based upon the master model. Instead, a transaction accurate model specifies clock cycles used to implement each transaction and also includes code used to calculate the correct output given any input. Basically, a transaction accurate model describes calculations and activities involved in realizing each function of the master model in a grouped together form, so that the descriptions can become smaller in size and may simulate faster.

FIG. 1 is an illustrative flow diagram of a process 100 to use a single input model to produce multiple equivalent models at different levels of abstraction. An input model 102 written in a high level hardware description language is provided to synthesis tool 104, which serves as a model translation system, which produces two models at different levels of abstraction. A first produced model 106 is at a transaction accurate level of abstraction. A second produced model 108 is at a cycle accurate level of abstraction. The two models are functionally equivalent in that at the boundaries where the models are consistent, given the same legal input sequence, both models would produce the same results. The qualifier "the boundaries where the models are consistent" means, a cycle accurate model can be compared with the RTL model at any clock edge. (e.g. just after midnight). It can not be compared to an RTL model when that model is halfway through a clock cycle (at say, for instance 8:33 in the morning). The transaction level model can be compared to cycle accurate models and RTL level models only just after the clock edge where a transaction has been completed.

In one embodiment the synthesis tool 104 comprises a computer system programmed to translate the high level abstraction input model 102 into two (or more) lower level abstraction models 106, 108. Functions performed by the model translation system 104 include a parser function for reading the syntax of the input master model 102 and building a model data structure that represents the semantics of the functions specified by the descriptions.

The models 102, 106 and 108 may be input to a simulation tool (not shown) to simulate the operation of hardware represented by these models. In general, the more detailed a model is, the more time is required to run a simulation using the model. Accordingly, a simulation tool running an input model 102 typically simulates hardware performance faster, but with less detail, than the transaction accurate model 106. Similarly, a simulation tool running a transaction accurate model 106 ordinarily simulates hardware performance faster, but with less detail, than the than the cycle accurate model 108.

During simulation using the input master model 102 (a process which is not shown), the simulation calculates the correct results. For instance, assuming the design is for a calculator, a simulation of the design (whether using a TLM, CA, or RTL), when fed the input sequence "press 3" "press +" "press 2" "press 7" "press =" would produce 30. However, the input master model 102 itself includes no notion of time. Results are ready as soon as they are requested. In other words, the input master model 102 does not include information relating actions or calculations involved in implementing functions to clock cycles or to clock edges. Thus, simulation using the input master model 102 produces results that do not relate actions or calculations to clock timing.

During simulation using the transaction accurate model 106 (which is not shown), the simulation calculates the correct results. Results are associated with the clock cycle in which they are produced during the simulation in accordance with the transaction accurate model 106. However, intermediate state and internals are not produced since they are not a part of a transaction level model. Thus, for example, if one stopped the simulation of a transaction accurate model halfway between two clock edges, and examined the values in the all of the various memory elements, they would not necessarily be the same as one would find in the RTL model, or in the actual device at that same instant of time.

During simulation using the cycle accurate model 108, not shown, the simulation calculates the correct results. The cycle accurate model 108 includes the notion of time. Results are associated with the clock cycle in which they are produced during the simulation in accordance with the cycle accurate model 108. Moreover, intermediate state and internals are accurately produced.

Referring again to FIG. 1, the transaction accurate model 108 may be provided to a software development team 110 for use in simulating hardware performance for software development purposes. In other words, the transaction accurate model 108 can be input to a simulation tool (not shown), which can be used to simulate the operation of the hardware at a level of abstraction sufficient to simulate the running of software on the modeled hardware. In this manner, software developers can develop software for the modeled hardware while the hardware still is in development, long before the actual hardware design is finalized and fixed in silicon. The level of timing resolution of the transaction accurate model 108 is adequate for this software development purposes because this model provides the software designers with the exact same view of the device they would get when running on the actual device. They can not write a program that would behave differently on the simulation than on the real device. Software developers can not determine the values of memory in their device between clock edges, so they can not tell if these are entirely faithful between two different simulations, or a simulation and the real thing. They will notice that the real thing runs much faster than the simulation, and that the RTL simulation is so slow as to be unusable. So, as they cannot have the real device (it hasn't been built yet!) they will choose the fastest model that they can get. Therefore, a hardware development team (not shown) can work in parallel with the software development team 110 to refine the design of the hardware in development.

There is an accurate correspondence between the produced models 106, 108. For example, for each action by the transaction accurate model 106 for which information is provided during a simulation run, there exists an action in the cycle accurate model 108 such during a simulation run such that the timing information between the actions is identical in each of the two simulations. Functionality and timing equivalency of the transaction accurate model 106 and the cycle accurate model 108 are achieved by one embodiment of the invention by building both models at the same time. Past practice has been for the user construct the detailed, second-by-second specification of the behavior (the RTL model) as the "master model". Certainly, an RTL model is needed in order to fabricate the chip. If a user could have only one model, the RTL model would be the one to have. However, the challenges of modern IC design mandate the creation of faster, abstracted models, if a design team is to have any realistic chance of implementing and testing the software to be used on a chip before the chip is fabricated. The RTL design simulates much too slowly for practical use. One possible approach is to try to create a system that can read the RTL model, and automatically abstract away the unnecessary details and construct the cycle based model, or the transaction level model from this source. This is easy to describe on paper; but actually constructing a system that can determine whether a particular register is being used to hold important algorithm data, or just scheduling data is quite difficult, especially when the creators of the RTL programs are a set of humans all with their own individual writing styles.

Instead, if we ask the user to specify the high level model (e.g., the TLM), and feed that to a tool in which we incorporate algorithms that build out the lower level representations (e.g., the RTL model) based on the human's guidance (number of pipeline stages, et cetera), and as the tool implements this, it marks the registers and control logic it inserts for scheduling purposes as such, then at the end of this process the tool can also emit a design with this scheduling apparatus omitted, and include just the number of pipe line stages chosen as the length of the transaction.

Equivalence between the transaction accurate model 106 and the cycle accurate model 108 is maintained as a feature of their construction. The tool builds the RTL model from its input, introducing sequencing logic, marking this logic as it produces it. Then the tool builds the cycle accurate model, without the intra-stage sequencing logic, but with the inter-stage sequencing logic it introduced in the RTL model. Then the tool builds the transaction level model, without any of the introduced sequencing logic; just the value of cycles that will occur in the RTL logic to perform each operation.

The cycle accurate model 106, when it has been sufficiently simulated and verified, is provided to a synthesis tool 112, which produces a gate level output model 114. The gate level output model 114 is used in the production of the actual hardware integrated circuit 116. It will be appreciated that there may be additional steps in the design and development process which are not shown since they do not relate closely to the principle of the invention herein. Meanwhile, the software development team 110 may be busy working in parallel with hardware development effort to produce software 118 that runs on the integrated circuit 116.

Thus, in one embodiment, an input master model 102 describes the functionality of integrated circuit hardware that is under development, without specifying timing of the intermediate steps of each function. At a minimum, a master model specifies inputs, outputs and the function between them. The master model may be written in a very high level description language such as SystemC. The minimum requirements of such a high level language is that it be capable of specifying all possible operations (e.g. add, subtract, divide, memory fetch, etc.) that constitute a function between inputs and outputs using a finite amount of memory. The language also may provide additional behavioral information, such as concurrency timing or causality relations.

In one embodiment preferred embodiment, the synthesis tool 104 produces, (1) a Register Transfer Level model 108 that maps the functionality described in the input model to a precise format in a standard hardware description languages, such as IEEE 1364.1 Verilog and/or IEEE 1076.6 VHDL;

(2) a Cycle Accurate model 120, in the System C language; and (3) a Transaction Accurate model 106, in the SystemC language.

The Register Transfer Level model includes a detailed specification of all of the activity taking place between each internal clock edge. A determination of what activities should occur within given set of internal clock edges is arrived at by the synthesis tool 104, for example, by allocating resources used to implement the activities, analyzing the time it takes for the resources to execute the activities, and then binding the activities to the available clock intervals. The Cycle Accurate model describes the calculations necessary to perform each function, with the calculations correctly distributed between each clock edge, but describes the calculations at an abstract (and hence faster to simulate) level. The Transaction Accurate model 120 describes the calculations necessary to perform each function, all grouped together, and scheduled to be done in the final cycle when the function would be completed in the RTL and Cycle Accurate descriptions, with no availability of intermediate results.

All of the produced models retain 106 108, 120 the same function between the inputs and outputs, and also the timing in clock cycles between the activities that read values from the inputs or write values to the outputs. The cycle accurate model 120, which specifies the function between the input and output, is best suited when one designs or verifies the function between the inputs and outputs. The RTL model 108 is best suited to implement hardware. The transaction accurate model 106 is best suited when one design or verifies a system that includes this hardware or other components in the system, such as software, in which the function and timing information between the inputs and outputs are necessary in order to complete the design and verification.

EXAMPLE

The following is a code example of an input master model code and its translation to an RTL model code and to transaction accurate model code.

Consider the following example of input master model code, which corresponds to an input master model 102 of FIG. 1:

```
class alu: public sc_module {
  ...
  SC_THREAD(adder);
  SC_THREAD(multiplier);
  ...
  void adder( ) {
    while (true)
      if (ENABLE && OPCODE == ADD) {
        port_OUT = port_IN1.read( ) + port_IN2.read( );
      }
    }
  }
}
```

This code describes an adder. Whenever ENABLE is true, and the OPCODE has the value ADD, the system will calculate the sum of the value on the input port in1 and input port in2, and drive the result to output port OUT. There is no specification of time in this code; only behavior.

There are many possible implementations of the behavior that are consistent with this specification. Differing implementations might perform the operation more quickly than another, or use less power to do the calculation (better battery life), or consume less area in the final chip (reserving space to be used to speed up the execution of other, more frequent operations). The user of a tool implementing this invention would typically provide constraints, such as worst case delay between two actions in the input master model or limitations upon elements of hardware resources that can be used in the implementations, to the tool that enable it to select one of the many possible implementations of this function based on optimizing some overall cost functions.

Below is a Register Transfer Level (RTL) format code implementation that may be produced from the above input master model circuit code using the synthesis tool 104 of FIG. 1. It should be noted that this more detailed RTL specification of behavior typically will require one or two orders of magnitude of additional time to simulate than will the original specification, above. The reason for the slower simulation speed is that this RTL model code contains much more information to be processed in the simulator than the input master model code, such as the timing characteristics of the hardware resources, the structural information of the hardware implementations, etc than will the original code specification, above. The additional detail is of course, is important for the correct fabrication of the circuit; but it is not needed for the verification of the software, so long as some system (such as the system and methods described herein) ensures that the two are equivalent from the software view point.

```
module alu (input enable, clock, reset;
    input [4:0] opcode;
    input [31:0] in1, in2;
    output [31:0] out);
  reg [5:0] state, next_state; // state machine
  reg [31:0] r1, r2, o;                    // intermediate
  values
  parameter s0 = 0, s1 = 1, s2 = 2, s3 = 3;
  always (@ posedge clock) begin
    if (reset) state = s0;
    else state = next_state;
  end
  always (@negedge clock) begin
    case (state)
      s0: if (enable && opcode == ADD)
          next_state = s1;
      s1: begin
          r1 = in1;
          r2 = in2;
          next_state = s2;
      end
      s2: begin
          o = r1 + r2;
          next_state = s3;
      end
      s3: begin
          out = o;
          next_state = s0;
      end
    endcase
  end
endmodule
```

The above RTL model has the simple function, as expressed in the high level model, where whenever we see an ENABLE signal, and the opcode ADD, we calculate the sum of our two inputs, expanded into further detail. Now there is a four (4) state state-machine that orchestrates the collection of the inputs on the first clock cycle, the calculation of the result on the second cycle, and the driving of the result on the third cycle. Note that the decision to make this a four state process (rather than a three state or five state process) is arbitrary, and is made based on the complexity of the rest of the circuit, the resources available, and the overall goal presented by the user when the synthesis run was initiated.

Given this description, a gate level model can be produced using well known techniques. Given this description, one can simulate the execution of software which occasionally would request this ADD instruction. In other words, one can execute, as a software program, this description that represents the RTL model. However, the detailed, step by step description of the process, which is needed by the RTL to gate level model transformation, has more detail than is needed to verify correct operation of the software. As a result, this model will not simulate as fast as it could if it eliminated this detail. The original model has no indication of time, and hence is not detailed enough for verification of the software.

Basically, to develop this kind of software, one needs to know what values the hardware will post at its outputs at which points in time (clock cycles), but one does not need to know how the hardware is implemented internally to post such values at the outputs, where the "detailed activities" are concerned with the latter Thus, there is a need for an intermediate model, which includes the timing specification that has been selected for implementation, but omits the detailed specification of the state by state execution of the model.

The following is a transaction accurate model code implementation that may be produced from the above input master model circuit code using the synthesis tool 104 of FIG. 1. The transaction accurate model code implementation can provide a software team 110 with a model that simulates more rapidly yet includes all of required timing details. In particular, the transaction accurate model retains timing information necessary to develop such software, i.e. between the inputs and outputs of the hardware, and it abstracts away the timing information internal to the hardware and not visible in the input and output function.

```
class alu: public sc_module {
  ...
  SC_THREAD(adder);
  sensitive << clock.pos( );
  SC_THREAD(multiplier);
  sensitive << clock.pos( );
  ...
  void adder( ) {
    while (true)
      if (ENABLE && OPCODE == ADD) {
        int temp;
        wait( );
        temp = port->IN1( ) + port->IN2( );
        wait(2 * clock.period( ));
        port->OUT( ) = temp;
      }
    }
  }
}
```

The above model will simulate at nearly the speed of the original model, but now includes the correct notion of time. In other words, the level of abstraction of the transaction accurate model code is very close to that of the original input master model code, i.e. the only difference is the additional timing information between the inputs and outputs, but now includes the correct notion of time. The port OUT will not get the value of IN1 and IN2 until 3 cycles after enable was true and the opcode held the value ADD. The data is sampled the cycle after the instruction is requested, again, preserving a software visible effect of the chosen RTL description. The fact that the output value is cached for one cycle is abstracted away, as this is not software visible. The state machine that orchestrates the execution is abstracted away as this is not software visible.

It will be appreciated that there are many possible levels of abstraction between the input master model and RTL such as for example:
(A) Function between the inputs and outputs;
(B) Function between the inputs and outputs plus timing information (in clock cycles) between the inputs and outputs as executed in the RTL model;
(C) Function between the inputs and outputs plus timing information (in clock cycles) plus activities executed in each clock cycle in the RTL model; or
(D) RTL model.

In addition, one can devise multiple levels of abstraction between (B) and (D), with respect to two dimensions: granularity of events (such as inputs, outputs, clock edges) and granularity with respect to structures (such as bits, registers). Moreover, the kinds of information annotated may not be restricted to timing, but also may include constraints such as power, noise, etc.

Figure 2:
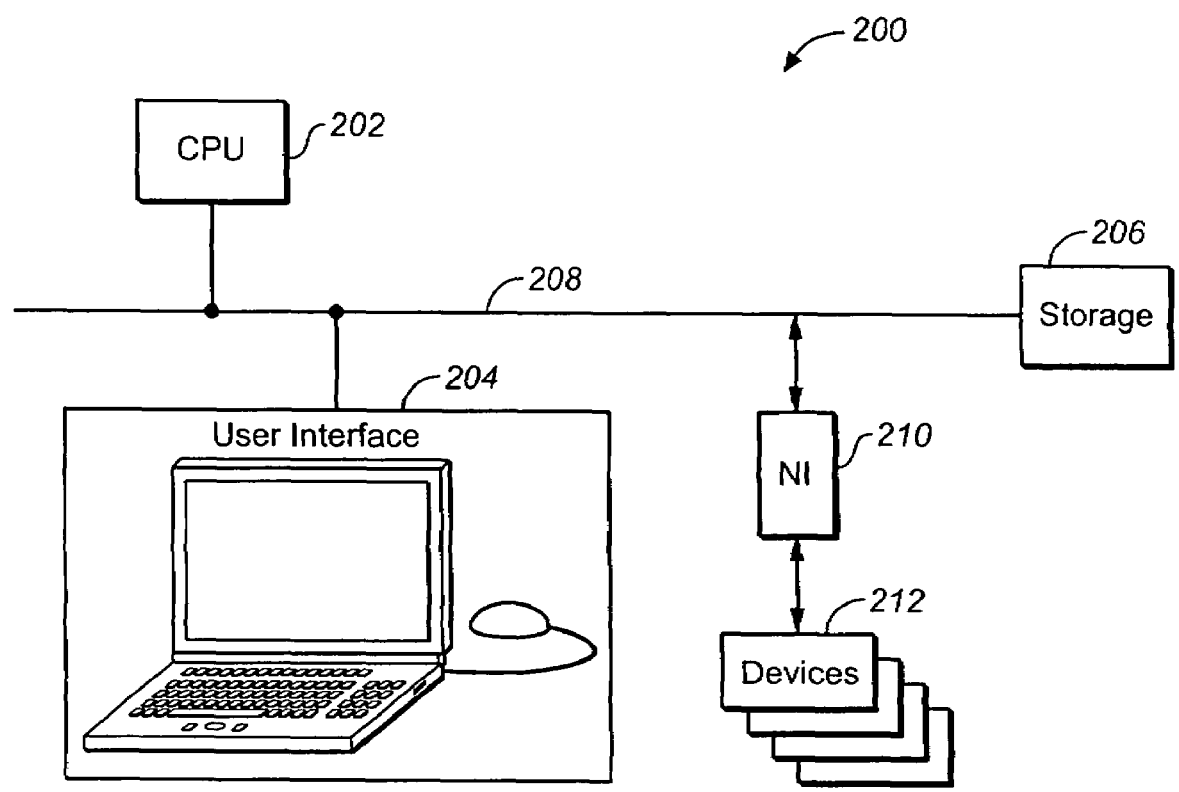
FIG. 2 is a schematic drawing of an illustrative computer system that can be programmed to implement a novel translation system of FIG. 1 in accordance with an embodiment of the invention.

FIG. 2 is a schematic drawing of an illustrative computer system 200 that can be programmed to implement a system and method of FIG. 1 in accordance with an embodiment of the invention. The computer system 200 includes one or more central processing units (CPU's) 202, a user interface 204, computer readable storage media 206, a system bus 208, and one or more bus interfaces for connecting the CPU, user interface, memory and system bus together. The computer system also includes a network interface 210 for communicating with other devices 212 on a computer network.

Computer readable input master models 102 of FIG. 1 may be provided, via bus 208, from interface 204, storage 206 or other devices 212, to the synthesis tool running from storage 206 on the CPU 202. The tool translates the input model into a transaction accurate model and a cycle accurate model and an RTL model of FIG. 1.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. A method of producing models of a design of an integrated circuit, the method comprising:
    providing a master model of a design of an integrated circuit; and
    translating the master model to at least a first model and a second model that are functionally equivalent to the master model and at different levels of abstraction from each other and wherein each of the first model and the second model include timing information of the design accurate for its respective level of abstraction;
    wherein the translating the master model to a first model comprises using a synthesis tool to produce a register transfer level model that includes at least one register and control logic used for scheduling: and
    wherein the translating the master model to a second model comprises using the synthesis tool to produce at least one of a transaction level model or a cycle accurate model functionally equivalent to the register transfer level model; and further comprising:
    in translating the master model to the register transfer level model, marking the at least one register and the control logic used for scheduling; and
    omitting the marked at least one register and control logic from the at least one transaction level model or cycle accurate model.

2. The method of claim 1, wherein
    the translating the master model to a first model comprises using a synthesis tool to produce a register transfer level model that specifies state-by-state execution between clock cycles of the design; and
    the translating the master model to a second model comprises using the synthesis tool to produce at least one of a transaction level model or a cycle accurate model functionally equivalent to the register transfer level model, and that does not specify state-by-state execution between the clock cycles of the design.

3. The method of claim 1, wherein the master model includes behavior information of the design and does not include timing information of the design.

4. The method of claim 1,
wherein the master model includes behavior information of the design and does not include timing information of the design; and
wherein the translating the master model to a first model comprises using a synthesis tool to produce a register transfer level model that specifies scheduling information between clock cycles of the design; and
wherein the translating the master model to a second model comprises using the synthesis tool to produce at least one of a transaction level model or a cycle accurate model functionally equivalent to the register transfer level model, and that does not specify scheduling information between clock cycles of the design.

5. The method of claim 1, wherein the master model does not include timing information of the design.

6. The method of claim 1, wherein the master model includes partial timing information of the design.

7. The method of claim 1,
wherein the translating the master model to a second model comprises using the synthesis tool to produce at least one of a transaction level model or a cycle accurate model that includes at least one of integrated circuit power, noise or timing information of the design in the at least one of the transaction level model or the cycle accurate model.

8. A computer readable storage medium storing code for performing the method of claim 1.

9. A computer system programmed to perform the method of claim 1.

10. A method of producing models of a design of an integrated circuit, the method comprising:
providing a master model of a design of an integrated circuit;
translating the master model to a first model using a synthesis tool to produce a register transfer level model of the design that specifies a value that will post at an output at at least one given integrated circuit clock cycle of the design and that specifies scheduling logic operative during the at least one given integrated circuit clock cycle ; and
translating the master model to a second model using the synthesis tool and the produced register transfer level model to produce at least one of a transaction level model or a cycle accurate model that specifies the same value that will post at the output of the register transfer level model at the at least one given integrated circuit clock cycle and that omits the specified scheduling logic.

11. The method of claim 10, further comprising:
inputting the at least one of the transaction level model or cycle accurate model to a simulation tool; and
using the simulation tool to simulate executing software on the inputted model.

12. The method of claim 10, further comprising:
inputting the transaction level model to a simulation tool;
using the at least one of the cycle accurate model of the simulation tool to simulate executing software on the transaction level model;
inputting the register transfer level model to the synthesis tool; and using the synthesis tool to produce a gate level model based on the register transfer level model.

13. The method of claim 10,
wherein the master model comprises behavior information of the design and does not include timing information of the design.

14. The method of 10, further comprising:
using the synthesis tool to translate the master model to a third model functionally equivalent to the master model and at a different level of abstraction than the first and second models, and which includes timing information of the design accurate for its level of abstraction.

15. The method of claim 10, further comprising:
using the synthesis tool to translate the master model to a third model functionally equivalent to the master model and at a different level of abstraction than the first and second models, and which includes timing information of the design accurate for its level of abstraction; and
wherein the first model comprises a register transfer level model;
wherein the second model comprises a cycle accurate model; and
wherein the third model comprises a transaction level model.

16. A computer system comprising:
a CPU;
a storage; and
a bus coupling the CPU to the storage;
wherein the storage stores code for execution by the CPU, the code performing:
providing a master model of a design of an integrated circuit; and
translating the master model to at least a first model and a second model that are functionally equivalent to the master model and at different levels of abstraction from each other and wherein each of the first model and the second model includes timing information of the design accurate for its respective level of abstraction;
wherein the translating the master model to a first model comprises using a synthesis tool to produce a register transfer level model that includes at least one register and control logic used for scheduling: and
wherein the translating the master model to a second model comprises using the synthesis tool to produce at least one of a transaction level model or a cycle accurate model functionally equivalent to the register transfer level model: and further comprising:
in translating the master model to the register transfer level model, marking the at least one register and the control logic used for scheduling: and
omitting the marked at least one register and control logic from the at least one transaction level model or the cycle accurate model.

17. A method of producing models of a design of an integrated circuit, the method comprising:
providing a master model of a design of an integrated circuit;
translating the master model using a synthesis tool to produce a register transfer level model of an operation of the design that specifies sequencing logic that includes one or more registers and control logic used for scheduling; and
translating the master model using the synthesis tool to produce a cycle accurate model that is functionally equivalent to the register transfer level model and that does not include interstage sequencing level specified in the register transfer logic model and that does include interstage sequencing logic specified in the register transfer level model.

18. The method of claim 17 further including:

translating the master model using the synthesis tool to produce a transaction accurate model that is functionally equivalent to the register transfer level model and that does not include interstage sequencing logic specified in the register transfer level model and that does not include interstage sequencing logic specified in the register transfer level model.

19. A method of producing models of a design of an integrated circuit, the method comprising:

providing a master model of a design of an integrated circuit;

translating the master model using a synthesis tool to produce a register transfer level model of an operation of the design that specifies sequencing logic that includes one or more registers and control logic used for scheduling; and translating the master model using the sythesis tool to produce a transaction accurate model that is functionally equivalent to the register transfer level model and that does not include interstage sequencing logic specified in the register transfer level model and that does not include interstage sequencing logic specified in the register transfer level model.

* * * * *